US007266263B2

(12) United States Patent
Ahn et al.

(10) Patent No.: US 7,266,263 B2
(45) Date of Patent: Sep. 4, 2007

(54) INTEGRATED WAVEGUIDE PHOTODETECTOR APPARATUS WITH MATCHING PROPAGATION CONSTANTS AND RELATED COUPLING METHODS

(75) Inventors: Donghwan Ahn, Cambridge, MA (US); Jifeng Liu, Cambridge, MA (US); Jurgen Michel, Arlington, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/269,354

(22) Filed: Nov. 8, 2005

(65) Prior Publication Data
US 2007/0104410 A1  May 10, 2007

(51) Int. Cl.
 *G02B 6/12*  (2006.01)
(52) U.S. Cl. .................................................... 385/14
(58) Field of Classification Search ............... 385/14
 See application file for complete search history.

(56) References Cited

U.S. PATENT DOCUMENTS

| 5,193,131 | A | * | 3/1993 | Bruno .......................... 385/14 |
| 5,747,860 | A | | 5/1998 | Sugiyama et al. |
| 5,910,012 | A | * | 6/1999 | Takeuchi ...................... 438/31 |
| 6,310,995 | B1 | * | 10/2001 | Saini et al. .................... 385/28 |
| 6,537,370 | B1 | * | 3/2003 | Hernandez et al. ............ 117/88 |
| 6,635,110 | B1 | * | 10/2003 | Luan et al. ...................... 117/4 |
| 6,646,317 | B2 | * | 11/2003 | Takeuchi ...................... 257/436 |
| 6,819,839 | B2 | * | 11/2004 | Zheng et al. .................. 385/43 |
| 6,856,733 | B2 | * | 2/2005 | Zheng ........................... 385/39 |
| 6,897,498 | B2 | | 5/2005 | Gothoskar et al. |
| 2003/0036217 | A1 | * | 2/2003 | Richard et al. ................ 438/98 |
| 2004/0179806 | A1 | | 9/2004 | Block et al. |

OTHER PUBLICATIONS

Rouvière et at., "Integration of germanium waveguide photodetectors for optical intr-chip interconnects" Sep. 2004, Procedure of SPIE, vol. 5453, pp. 142-144.*
Luan et al., "Materials processing technology for the integration of effective Ge p-i-n photodetectors on Si for Si microphotonics" May 2001, Procedure of SPIE, vol. 4293.*
Laura Marie Giovane, "Strain-balanced silicon-germanium materials for near IR photodetection in silicon-based optical interconnects" Aug. 1998, Massachusetts Institute of Technology.*
Tolstikhin et al., "Single-mode vertical integration of p-i-n photodetectors with optical waveguides for monitoring in WDM trasmission systems", Jun. 2003, Photonics Technology Letters, IEEE, vol. 15, Issue 6, pp. 843-845.*
Yoshimoto et al., "SOI Waveguide GeSi Avalanche Pin Photodetector at 1.3 μm Wavelength," IEICE Trans. Electron., vol. E81-C, No. 10 (1998) pp. 1667-1669.
International Search Report for Application No. PCT/US2006/020931 dated Sep. 29, 2006 (5 pages).
Written Opinion for Application No. PCT/2006/020931 mailed Oct. 10, 2006 (8 pages).

* cited by examiner

*Primary Examiner*—Michelle Connelly-Cushwa
*Assistant Examiner*—Kajli Prince
(74) *Attorney, Agent, or Firm*—Goodwin Procter LLP

(57) ABSTRACT

High-speed optoelectronic devices having a waveguide densely integrated with and efficiently coupled to a photodetector are fabricated utilizing methods generally compatible with CMOS processing techniques. In various implementations, the waveguide consists essentially of single-crystal silicon and the photodetector contains, or consists essentially of, epitaxially grown germanium or a silicon-germanium alloy having a germanium concentration exceeding about 90%.

35 Claims, 8 Drawing Sheets

INTEGRATED WAVEGUIDE PHOTODETECTOR APPARATUS WITH MATCHING PROPAGATION CONSTANTS AND RELATED COUPLING METHODS

FIELD OF THE INVENTION

This invention relates generally to optoelectronic devices and, specifically, to methods and materials for fabrication of waveguide-based photodetector devices.

BACKGROUND OF THE INVENTION

Various optoelectronic applications, such as optical telecommunications and intra-chip interconnects, involve transmitting optical signals and converting them to electrical signals at high data rates. Systems for performing such transmission and conversion usually require photodetector devices compatible with the speed and bandwidth of the optical signal. Typically, these devices are PIN detectors— i.e. semiconductor devices including an intrinsic region sandwiched between a p-type region and an n-type region— that have frequency responses in the GHz range and utilize optical waveguides as a conduit for directing light to the intrinsic region of the photodetector.

Generally, an optical waveguide is a planar, rectangular, or cylindrical structure having a high-index core surrounded by a low-index cladding. Light rays are predominantly confined in the core by internal reflection at the core/cladding interface, with a small portion of the light propagating in the cladding as an evanescent wave. In order to form a high-speed waveguide-based photodetector, a lightwave traveling in the optical waveguide is coupled to the intrinsic region of the photodetector, where the light is converted to photon-generated carriers. The carriers then diffuse out to the electrodes, e.g. the p- and n-type regions of the PIN detector, producing an electrical signal (e.g., a photocurrent) that corresponds to the detected light. To reduce scattering and improve detection efficiency, the intrinsic region of a PIN photodetector should be in direct contact with or sufficiently close to either a waveguide's butt end or to its surface. In the latter case, light can be coupled to the intrinsic region via the evanescent wave, a phenomenon referred to as "evanescent coupling."

The speed of the detector generally depends on the time it takes for the photon-generated carriers to reach the electrodes. This time is referred to as the "transit time." The narrower the intrinsic region, the shorter the transit time and the faster the detector. A fast photodetector allows for the detection and processing of high-speed optical signals.

As mentioned above, one potential application of such integrated photodetector devices relates to optical intra-chip interconnects. Recently, the increasing computing power of modern microelectronic devices has given rise to the need for smaller transistors and increased operating speeds that translate to higher density metallic interconnect lines carrying more current. The smaller cross-sectional dimensions of interconnects, however, generally lead to resistance-capacitance time delays and electromigration failure issues. Furthermore, the clock distribution typically consumes as much as 70% of the total power dissipated on a chip. Thus, conventional interconnects may impede further developments in microelectronic technology. In that regard, integrated photodetector devices present a promising alternative to the metallic interconnects, enabling novel microprocessor architectures by permitting significant increases in the intra- and inter-chip data transfer rates and reducing power consumption.

Implementation of these integrated photodetectors as optical interconnects for microelectronic devices, however, presents a number of challenges because different fabrication techniques are typically employed for microelectronic and optical components. Thus, it is desirable to incorporate the optical components onto a chip without jeopardizing CMOS processing compatibility or interfering with the operation of CMOS devices. In that regard, silicon-on-insulator ("SOI") substrates, commonly used in CMOS fabrication, are particularly attractive for incorporating optical components with microelectronic devices. Specifically, using SOI as a starting substrate, low-loss waveguides can be defined in the top silicon layer. The high refractive index contrast between silicon and its oxide enables high light confinement in microscale strip waveguides. With respect to the photodetector, however, many applications having optical components that operate at wavelengths longer than silicon's absorption edge (1.3 μm to 1.55 μm) require an active material other than pure silicon to achieve acceptable absorption levels and generate photocurrent. Bulk germanium and/or silicon-germanium compounds have been previously proposed as suitable candidates for the photodetector material in silicon-based integrated waveguide photodetectors. See, for example, "Integration of Germanium Waveguide Photodetectors for Optical Intra-Chip Interconnects" by Rouvière et al. (Proceedings of SPIE, vol. 5453, 2004) and "Strain-Balanced Silicon-Germanium Materials for Near IR Photodetection in Silicon-Based Optical Interconnects" by Giovane (Ph.D. Thesis, MIT, 1998), both incorporated herein by reference.

Known approaches for integrating germanium-based photodetectors with silicon-based waveguides, however, suffer from several process- and performance-related drawbacks, including poor confinement and coupling efficiency, suboptimal integration density, and complexity of fabrication. For example, some techniques known in the art employ a vertical arrangement of the components, whereby a waveguide is disposed over the photodetector. Fabrication of these structures typically entails a surface-preparation step, e.g. chemical-mechanical polishing, prior to photodetector deposition.

Thus, there is a need in the art for versatile and cost-effective methods of fabricating integrated waveguide-based photodetector devices that are generally compatible with CMOS processing techniques. There is also a need in the art for integrated high-speed waveguide-based photodetector device with improved detection capabilities and integration density.

SUMMARY OF THE INVENTION

Heterointegration of lattice-mismatched materials is desirable for various electronic and optoelectronic applications. For example, as mentioned above, the possibility of the heterointegration of III-V, II-VI materials, and/or Ge with Si is an attractive path for fabricating integrated devices transmitting optical signals and converting them to electrical signals at high data rates.

Accordingly, it is an object of the present invention to provide optoelectronic devices that address both process- and performance-related limitations of known approaches. Generally, in its various aspects and embodiments, the invention disclosed herein focuses on optoelectronic devices having a waveguide densely integrated with and efficiently coupled to a photodetector, as well as on optoelectronic circuits employing such devices. The invention also features methods for fabricating such integrated devices preferably utilizing selective epitaxy and being generally compatible with CMOS processing techniques.

In general, in one aspect, the invention features an integrated photodetector apparatus that includes a substrate having a first cladding layer disposed over a base layer. The apparatus further includes (i) an optical waveguide disposed over the substrate, and (ii) an interface region disposed over the first cladding Layer. The base layer and the interface region contain, or consist essentially of, a first semiconductor material. The optical waveguide has a first propagation constant. The apparatus also includes a photodetector having a second propagation constant substantially equal to the first propagation constant. The photodetector contains, or consists essentially of, a second semiconductor material epitaxially grown over the interface region and has a source region and a drain region separated by an intrinsic region formed in the second semiconductor material. At least a portion of the intrinsic region is laterally aligned with and evanescently coupled to the optical waveguide.

Embodiments of this and other aspects of the claimed invention include the following features. Optionally, the largest cross-sectional dimension of the photodetector does not exceed a length of absorption of photocarriers therein. Also, the optical waveguide may have a first portion and a second portion, such that, in some embodiments, at least a portion of the intrinsic region is laterally aligned with and evanescently coupled at least to the second portion. Also, in these embodiments, a width of the first portion may range from about 0.5 µm to abot 1.5 µm and may exceed a width of the second portion.

In this and other aspects of the invention, the first semiconductor material may contain, or consist essentially of, single-crystal silicon. Also, the first cladding layer may contain, or consist essentially of, silicon dioxide. The photodetector may contain, or consist essentially of, germanium or a silicon-germanium alloy having a germanium concentration exceeding about 90%. In various embodiments, the optical waveguide is disposed over the first cladding layer and contains, or consists essentially of, silicon, silicon nitride, or silicon oxynitride.

Optionally, the photodetector apparatus also includes (i) contact regions in electrical communication with the source and the drain regions and/or (ii) a second cladding layer disposed over the optical waveguide and the photodetector. The second cladding layer may contain, or consist essentially of, silicon dioxide.

Further, in many embodiments of this and other aspects of the invention, the thickness of the photodetector does not exceed about 1.5 µm. In various embodiments, the waveguide is a single-mode structure. In some versions of these embodiments, the thickness of the interface region is less than about 1 µm, for example, is about 0.2 µm. Further, a distance between the optical waveguide and the photodetector is less than about 1 µm, for example, is about 0.2 µm.

Generally, in another aspect, the invention focuses on an integrated photodetector apparatus that includes a substrate having a first cladding layer disposed over a base layer. An optical waveguide having a first propagation constant is disposed over the substrate. Further, an interface region is disposed over the first cladding layer. The base layer and the interface region contain, or consist essentially of, a first semiconductor material. A first doped region is formed in the interface region. The apparatus further includes a photodetector having a second propagation constant substantially equal to the first propagation constant. The photodetector contains, or consists essentially of, a second semiconductor material epitaxially grown over the interface region and has a second doped region and an intrinsic region disposed thereunder. At least a portion of the intrinsic region is laterally aligned with and evanescently coupled to the optical waveguide. One of the doped regions includes a source region, and the other doped region includes a drain region.

Also, in two further aspects, the invention relates to an optoelectronic circuit that includes an integrated photodetector apparatus, a light source, and an electronic device. In particular, in one of these aspects the integrated photodetector apparatus includes a substrate having a first cladding layer disposed over a base layer. The apparatus further includes (i) an optical waveguide disposed over the substrate, and (ii) an interface region disposed over the first cladding layer. The base layer and the interface region contain, or consist essentially of, single-crystal silicon. The optical waveguide has a first propagation constant. The apparatus also includes a photodetector having a second propagation constant substantially equal to the first propagation constant. The photodetector contains, or consists essentially of, a second semiconductor material epitaxially grown over the interface region and has a source region and a drain region separated by an intrinsic region formed in the second semiconductor material. At least a portion of the intrinsic region is laterally aligned with and evanescently coupled to the optical waveguide. The largest cross-sectional dimension of the photodetector does not exceed a length of absorption of photocarriers therein. Further, a second cladding layer that contains, or consists essentially of, silicon dioxide is disposed over the optical waveguide and the photodetector. In the other aspect, the integrated photodetector apparatus includes an interface region having a first doped region formed therein and disposed over a substrate having a first cladding layer disposed over a base layer. The interface region and the base layer contain, or consist essentially of, single-crystal silicon. An optical waveguide having a first propagation constant is disposed over the first cladding layer. The photodetector apparatus further includes a photodetector having a second propagation constant substantially equal to the first propagation constant. The photodetector contains, or consists essentially of, a semiconductor material epitaxially grown over the interface region and has a second doped region and an intrinsic region disposed thereunder. At least a portion of the intrinsic region is laterally aligned with and evanescently coupled to the optical waveguide. One of the doped regions includes a source region, and the other doped region includes a drain region. The largest cross-sectional dimension of the photodetector does not exceed a length of absorption of photocarriers therein. A second cladding layer that contains, or consists essentially of, silicon dioxide is disposed over the optical waveguide and the photodetector.

Within the optoelectronic circuits according to both aspects described above, the light source is in optical communication with an input end of the optical waveguide for directing a lightwave thereto, and the electronic device is electrically coupled to the source and drain regions for receiving and processing an electrical signal generated in the photodetector.

In yet another two aspects, in general, the invention relates to methods for manufacturing an integrated photodetector apparatus. In both aspects, the methods include providing a silicon-on-insulator substrate that includes an interface region disposed over the first cladding layer. The interface region contains, or consists essentially of, single-crystal silicon, and the first cladding layer contains, or consists essentially of, silicon dioxide. In one of these aspects, the method further includes forming a first doped region in the interface region and epitaxially growing a lattice-mismatched semiconductor layer over the interface region of the substrate and at least partially over the first doped region. The method also includes removing a portion of the lattice-mismatched semiconductor layer and a portion of the interface region to (i) form a photodetector including an intrinsic region and (ii) expose a portion of the first cladding layer; and then forming an optical waveguide over the exposed portion of the first cladding layer, such that at least a portion of the intrinsic region is laterally aligned with and evanescently coupled to the optical waveguide. In the other aspect, the method further includes epitaxially growing a lattice-mismatched semiconductor layer over the interface region of the substrate, and then removing a portion of the lattice-mismatched semiconductor layer and a portion of the interface region to (i) form a photodetector including an intrinsic region, and (ii) expose a portion of the first cladding layer. The method also includes forming an optical waveguide over the exposed portion of the first cladding layer, such that at least a portion of the intrinsic region is laterally aligned with and evanescently coupled to the optical waveguide; and forming a source region and a drain region in the photodetector.

Embodiments of at least one these two aspects of the invention include the following features. A cladding layer that contains, or consists essentially of, silicon dioxide may be deposited over the optical waveguide and the photodetector. A second doped region can be formed in the photodetector, one of the doped regions includes a source region, and the other doped region includes a drain region, and then contact regions electrically coupled to the source and drain regions can be formed. The lattice-mismatched semiconductor layer may contain, or consist essentially of, germanium or a silicon-germanium alloy having a germanium concentration exceeding about 90%. The optical waveguide may contain, or consist essentially of, silicon, silicon nitride, or silicon oxynitride.

In various embodiments, the largest cross-sectional dimension of the photodetector does not exceed a length of absorption of photocarriers therein. Also, the thickness of the photodetector does not exceed about 1.5 µm. In various embodiments, the waveguide is a single-mode structure. In some versions of these embodiments, the thickness of the interface region is less than about 1 µm, for example, is about 0.2 µm. Further, a distance between the optical waveguide and the photodetector is less than about 1 µm, for example, is about 0.2 µm.

Optionally, the step of epitaxially growing the lattice-mismatched semiconductor layer includes (i) depositing a semiconductor material over the interface region at a first temperature to form a buffer layer; and (ii) depositing the semiconductor material over the buffer layer at a second temperature until a final thickness is obtained. A thickness of the buffer layer may range from about 30 nm to about 60 nm. In various embodiments, the final thickness does not exceed about 1.5 µm. Also, the second temperature can be greater than the first temperature. The step of epitaxially growing the lattice-mismatched semiconductor layer may further include annealing the semiconductor material, for example, at a temperature greater than about 850° C. for at least 15 minutes, or by rapid thermal annealing at a temperature greater than about 850° C. for about 3 minutes.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

In accordance with its various embodiments, the invention disclosed herein contemplates fabrication of integrated waveguide-based photodetector apparatus with improved detection capabilities and integration density utilizing methods that are generally compatible with CMOS processing techniques. Also contemplated are optoelectronic circuits including at least one integrated photodetector apparatus, a light source for directing a lightwave thereto, and one or more electronic devices for receiving and processing an electrical signal generated in the photodetector apparatus.

As discussed in more detail below, efficient evanescent coupling between components in the integrated apparatus of the invention is facilitated by epitaxially growing a photodetector in lateral alignment with an optical waveguide, as well as by matching propagation constants of the photodetector and the waveguide. Selective epitaxy is suitable for fabricating optoelectronic devices according to many embodiments of the invention because it is only marginally, if at all, disruptive to a conventional CMOS process performed on the same wafer, and, therefore, is particularly attractive for incorporating optical components with microelectronic devices.

In various embodiments, the largest cross-sectional dimension of the photodetector does not exceed a length of absorption of photocarriers therein, which generally enhances the detection speed by reducing the capacitance and/or carriers' drift time. Further, as mentioned above, the dimensions of the photodetector and the waveguide are selected such that propagation constants of the photodetector and the waveguide closely match. As a result, evanescent coupling efficiency is generally increased. In addition, matching of propagation constants allows for a larger gap between the photodetector and the waveguide for a given coupling rate, thereby easing photolithographic constraints during fabrication of the integrated device. In addition, in many embodiments, the waveguide's lateral dimension is tapered to reduce its width where evanescent coupling with the photodetector occurs. As a result, the evanescent tail of the lightwave in the waveguide expands laterally, further improving coupling efficiency.

While generally described in connection with germanium or silicon-germanium photodetectors integrated with silicon or silicon-based (e.g. silicon nitride or silicon oxynitride) optical waveguides employing silicon or SOI wafers as starting substrates, the invention is not thusly limited and other materials and starting substrates are contemplated without departing from the scope or spirit of the invention.

Figure 1A:
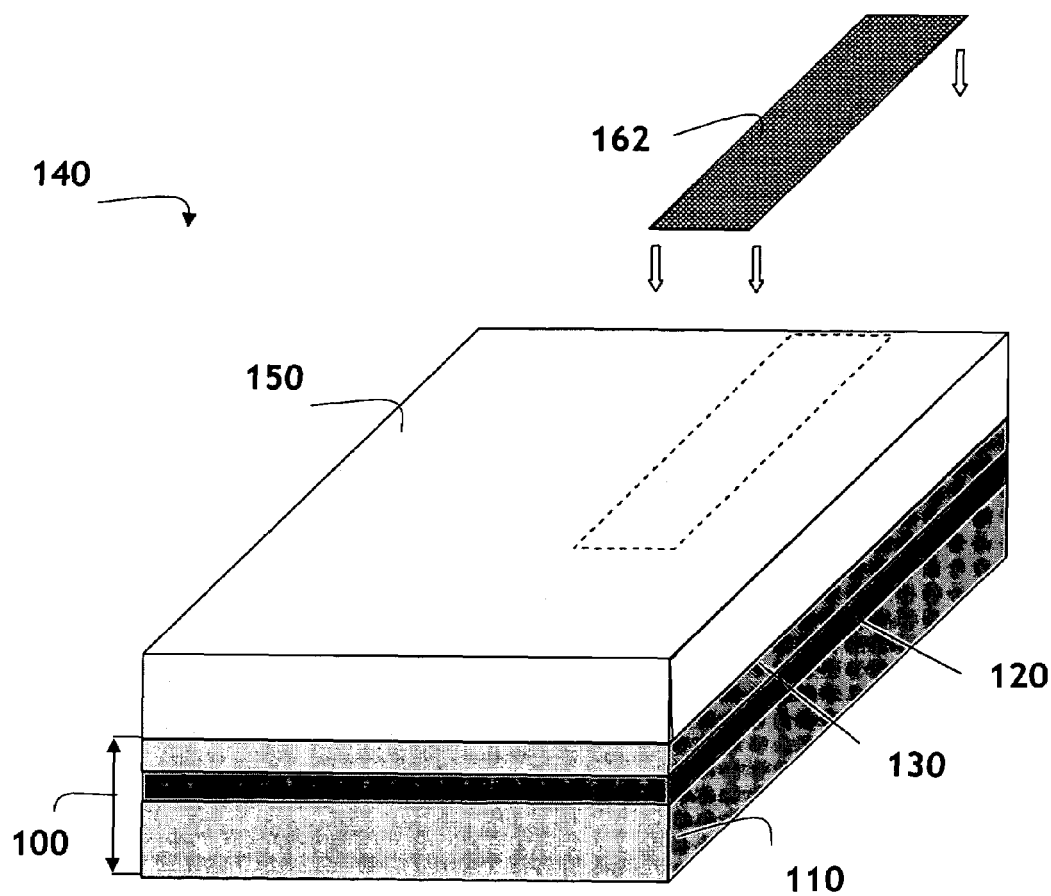
FIGS. 1A-1B, 2, and 3A-3B depict schematic perspective and cross-sectional side views illustrating formation of integrated optoelectronic devices according to various embodiments of the claimed invention.

Referring to FIG. 1A, in various embodiments, fabrication of the integrated waveguide-based photodetector apparatus starts with a substrate 100 having a base semiconductor layer 110 and an insulator layer 120 disposed thereon. The insulator layer will ultimately serve as a bottom cladding layer of the waveguide. Further, a top semiconductor layer 130 is disposed over the insulator layer. In a particular embodiment, the substrate 100 is a SOI wafer such that the top and the base semiconductor layers consist essentially of single-crystal silicon and the insulator layer consists essentially of silicon dioxide. In some embodiments, a first doped region (not shown), which may include either a source region or a drain region, is then formed in the top semiconductor layer 130 by any of the methods known in the art, for example, by dopant implantation, such that the integrated device has a vertical PIN configuration. Examples of suitable dopants are n-type dopants such as phosphorus, arsenic, and antimony, or a p-type dopant, such as boron. Dopant ions may be implanted by directing a dopant-containing gas, such as phosphine, arsine, stibine, and/or diborane, at the exposed portion of the top layer. The dopant gas is typically diluted in a carrier gas to, for example, approximately 1% concentration. In other embodiments, the first doped region (e.g. a source region) is formed in the top surface of the photodetector (such that the integrated device has a lateral PIN configuration), as described in more detail below.

Still referring to FIG. 1, an intermediate heterostructure 140 is formed by epitaxially depositing a radiation-absorption layer 150 over the top semiconductor layer 130. In various embodiments, the layer 150 contains, or consists essentially of, a lattice-mismatched semiconductor material. The lattice-mismatched semiconductor material is selected depending, in part, on the desired optical absorption properties of the photodetector material for a given wavelength. In various embodiments, the lattice-mismatched semiconductor material is bulk germanium or a silicon-germanium alloy having a germanium concentration exceeding about 90%. As skilled artisans will readily recognize, for typical wavelengths used in optoelectronic applications, the optical absorption coefficient of bulk germanium disposed over silicon substrate is very high—e.g. about 9,000 $cm^{-1}$ for a wavelength of about 1.3 μm and between 2,000 and 4,000 $cm^{-1}$ for a wavelength of about 1.55 μm.

The lattice mismatch—i.e. the difference in crystalline lattice sizes between the top semiconductor layer 130 and the layer 150—creates stress during material deposition that generates dislocation defects in the resulting heterostructure. In order to improve the quality of the lattice-mismatched material of the layer 150, in various embodiments of the invention, multi-step epitaxial growth methods, such those described in, for example, U.S. Pat. Nos. 6,537,370 and 6,635,110, as well as in "Materials processing technology for the integration of effective Ge p-i-n photodetectors on Si for Si microphotonics," Proceedings of SPIE," vol. 4293, pgs. 118-122 (2001), all incorporated herein by reference, are employed. Specifically, in a particular embodiment, the epitaxial growth of the germanium layer 150 over the silicon layer 130 of the SOI wafer 100 is carried out in two steps in an ultra-high vacuum chemical vapor deposition (UH-VCVD) system. First, a thin (i.e. having a thickness ranging from about 30 nm to about 60 nm) substantially relaxed germanium buffer layer is epitaxial grown at a temperature of about 350° C. in order to plastically relax the strain therein without formation of undesirable dislocation pile-ups. Then, the epitaxial growth continues at higher temperatures, e.g. about 600° C., until a desired final thickness of the layer 150 is obtained. In many embodiments, the final thickness of the layer 150 does not exceed about 1.5 μm, for example, is about 1 μm. As mentioned above, the largest cross-sectional dimension of the photodetector does not exceed a length of absorption of photocarriers therein, which generally enhances the detection speed by reducing the capacitance and/or carriers' drift time.

In some embodiments, in order to further improve the quality of the layer 150 by facilitating removal of threading dislocations towards the edges of the heterostructure, the multi-step epitaxial growth may be supplemented by annealing the lattice-mismatched semiconductor material, for example, at a temperature of about 850° C.-900° C. for at least 15 minutes, or by rapid thermal annealing at a temperature greater than about 850° C. for about 3 minutes. Another suitable post-deposition method includes thermal cycling between 780° C. and 900° C. (e.g. 10 minutes at each temperature).

Figure 1B:
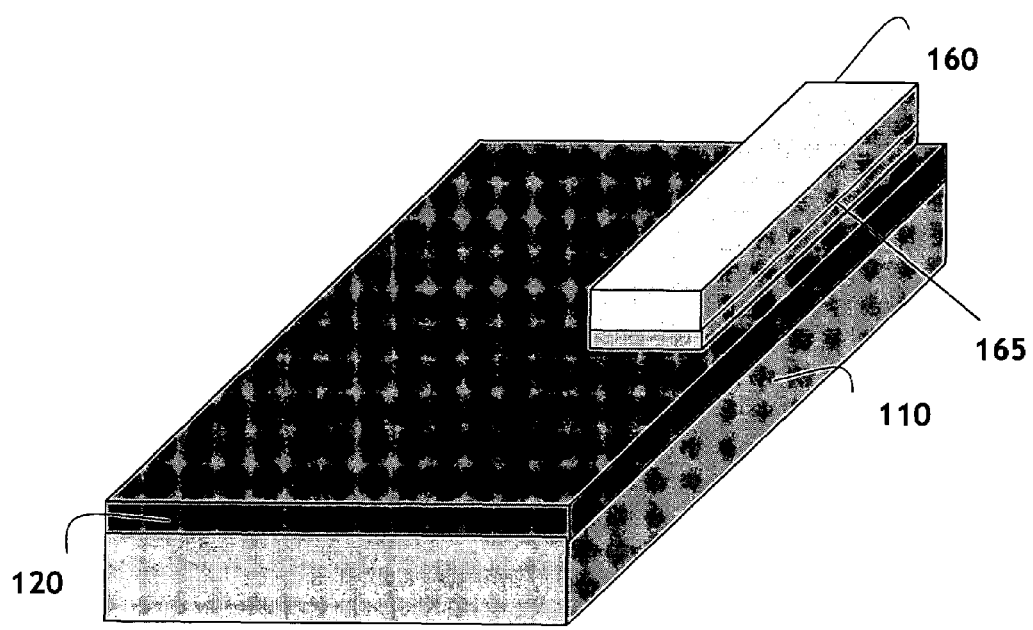

Referring to FIGS. 1A-1B, a photodetector 160 is then defined in the top semiconductor later by any method known in the art, for example, by applying a mask 162 having a desired configuration of the photodetector over the layer 150 followed by etching of portions of the layers 150, 130 exposed by the mask. As a result, the photodetector 160 is disposed over the interface region 165.

Figure 2:
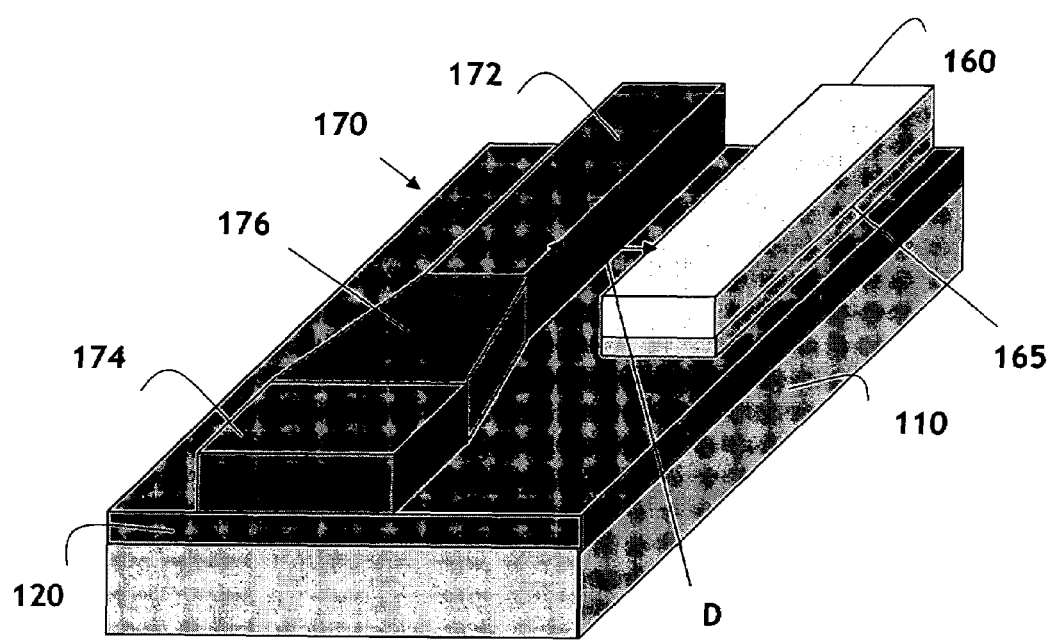

Referring to FIG. 2, a waveguide 170 may then be formed, e.g. deposited, over the cladding layer 120 proximate to the photodetector 160 using, for example, any of conventional chemical vapor deposition techniques in conjunction with photolithography. For example, a waveguide material can be deposited over the entire surface of the layer 120, including the photodetector. Then, a desired configuration of the waveguide 170 is masked and the exposed portions of the waveguide material are removed.

In many embodiments, the waveguide contains, or consists essentially of, silicon, silicon nitride, and/or silicon oxynitride. The choice of the material for the waveguide depends from, among other factors, performance characteristics in a desired range of wavelengths. In various embodiments, to improve detection capabilities, coupling efficiency, and/or simplify fabrication, the waveguide 170 includes a narrow portion 172, a wide portion 174, and an intermediate tapered portion 176 disposed therebetween. The narrow portion 172 is generally disposed proximate to the photodetector 160. Width of the tapered portion continuously decreases from the wide portion towards the narrow portion. Also, in various embodiments, the waveguide is a single-mode structure, i.e. a structure in which only the lowest-order bound mode can propagate at a given wavelength. Generally, the lowest-order bound mode is ascertained for the given wavelength by solving Maxwell's equations for the boundary conditions imposed by the waveguide, e.g., core (spot) size and the refractive indices of the core and cladding. Thus, keeping in mind that the range of wavelengths typically used in optoelectronic applications is 1.3-1.55 μm, in some versions of these embodiments, a width of the narrow portion is less than about 1 μm, or, in a particular version, is about 0.5 μm. A width of the wide portion ranges from about 1 μm to about 10 μm, for example, is between about 1 μm and about 4 μm, or, in a particular version, ranges from about 1.2 μm to about 2 μm.

As mentioned above, the dimensions of the photodetector and the waveguide are selected such that propagation constants of the photodetector and the waveguide closely match. As a result, evanescent coupling efficiency is generally increased. In many embodiments, the thickness of the optical waveguide is less than about 1.5 μm, for example, is about 1 μm.

Further, as mentioned above, matching of propagation constants allows for a generally larger gap D between the photodetector and the portion 172 of the waveguide for a given coupling rate (as compared to a waveguide/photodetector lateral coupling without matching of propagation constants), thereby easing photolithographic constraints during fabrication of the integrated device. In many embodiments, the gap D is less than about 1 μm, for example, is about 0.2 μm.

Figure 3A:
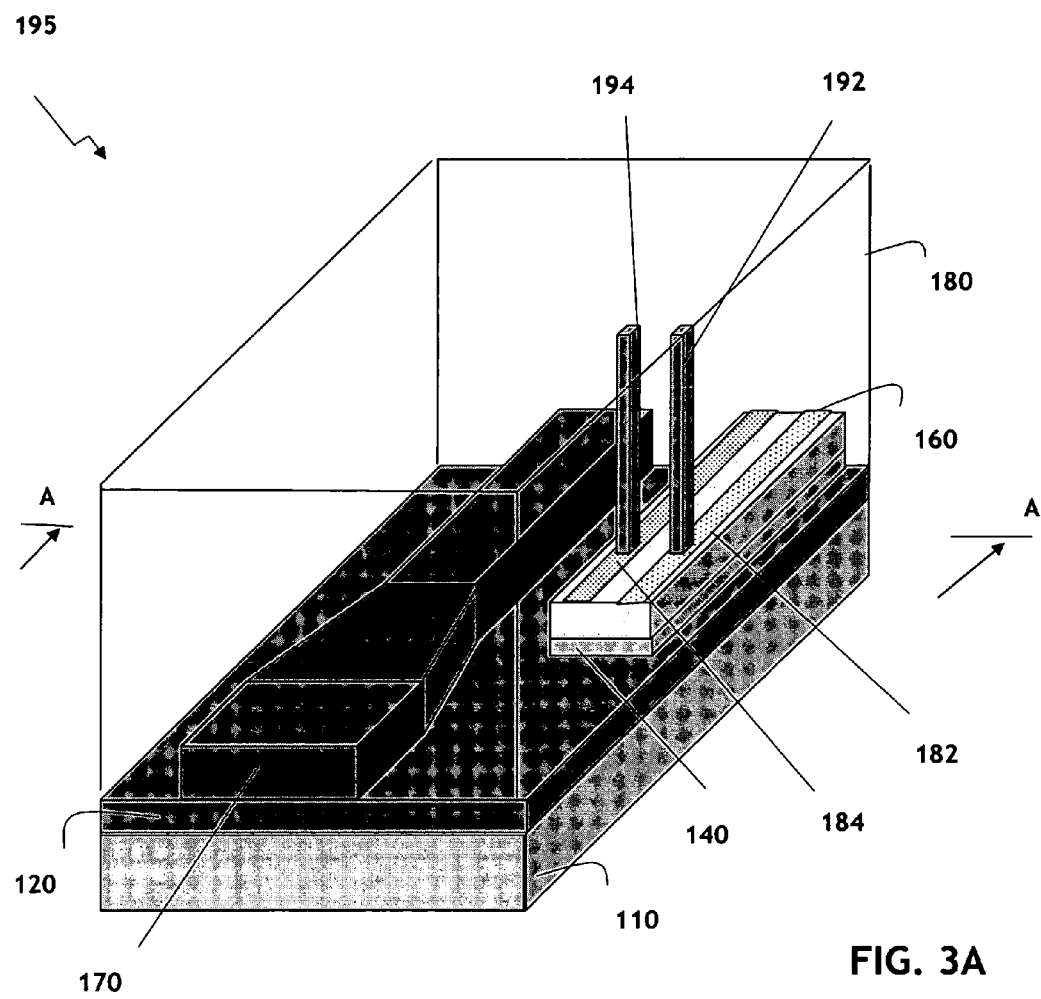
Figure 3B:
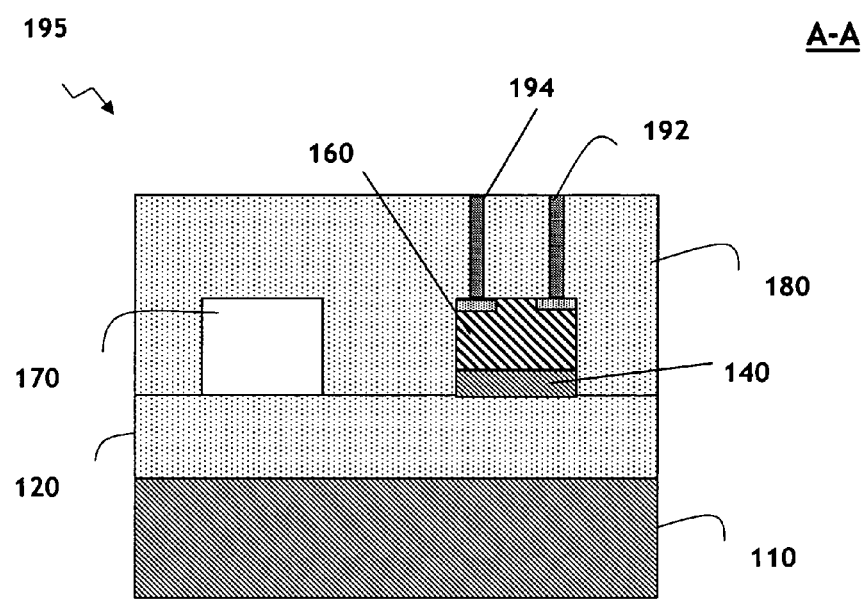

Referring now to FIGS. 3A-3B, in various embodiments, a top cladding layer 180 (depicted as transparent in FIG. 3A for illustration purposes) is deposited over the waveguide 170 and the photodetector 160 by, for example, any of conventional chemical vapor deposition techniques. In many embodiments, the top cladding layer contains, or consists essentially of, silicon dioxide or silicon oxynitride.

The interface between the photodetector 160 formed, in some embodiments, of germanium or a silicon-germanium alloy with high germanium content and the surrounding cladding material, e.g. silicon dioxide or silicon oxynitride, facilitates confinement of photocarriers within the intrinsic region of the photodetector, such that substantially all unabsorbed light is back-reflected at the interface. As a result, unabsorbed photocarriers travel vertically through the photodetector between the waveguide and the top cladding layer until fully absorbed. This phenomenon, in turn, enables desirable detection capabilities of the photodetector while employing relatively thin layers of the absorbing material, thereby enhancing the detection speed. As mentioned above, in various embodiments, a thickness of the photodetector is less than about 1.5 μm, for example, is about 1 μm.

Following the deposition of the top cladding layer, a portion thereof over the photodetector 160 is removed, for example, by etching, such that portions of the top surface of the photodetector are exposed, and then a source region 182 and a drain region 184 is formed in those portions by, for example, ion implantation. As mentioned above, examples of suitable dopants are n-type dopants such as phosphorus, arsenic, and antimony, or a p-type dopant, such as boron. Dopants may be implanted using a dopant gas, such as phosphine, arsine, stibine, and/or diborane. The opening in the top cladding layer over the source and drain regions can then be filled by the cladding material, such as, for example, silicon dioxide or silicon oxynitride. Further, contact regions 192, 194 may be formed to provide electrical communication with the source and drain regions employing methods known in the art. For example, contact holes are defined through the layer 180 over a portion of the source region and a portion of the drain region, and then filled with a contact material. In a particular embodiment, the contact material is a metal compound that is thermally stable and has low electrical resistivity at the semiconductor/refractory metal interface, such as a metal germanicide and/or metal silicide including, for example, cobalt, titanium, tungsten, molybdenum, platinum, nickel, or tantalum. Preferably, the contact regions are formed by a self-aligned process, in which the contacts are formed only in the areas where the deposited metal is in direct contact with the source/drain regions. As a result, an integrated waveguide-based photodetector apparatus 195 employing a lateral PIN configuration is fabricated. Because of the compact coupling and design configuration of the components, integration density and detection speed and sensitivity are generally enhanced. As mentioned above, in alternative embodiments, a first doped region can be formed in the interface region 165. In those embodiments, only a second doped region 184, which may include either a source region or a drain region, is formed in the photodetector, such that one of the first and second doped regions includes a source region, and the other doped region includes a drain region. Following formation of the contact regions as described above, an integrated waveguide-based photodetector apparatus employing a vertical PIN configuration is fabricated.

Figure 4A:
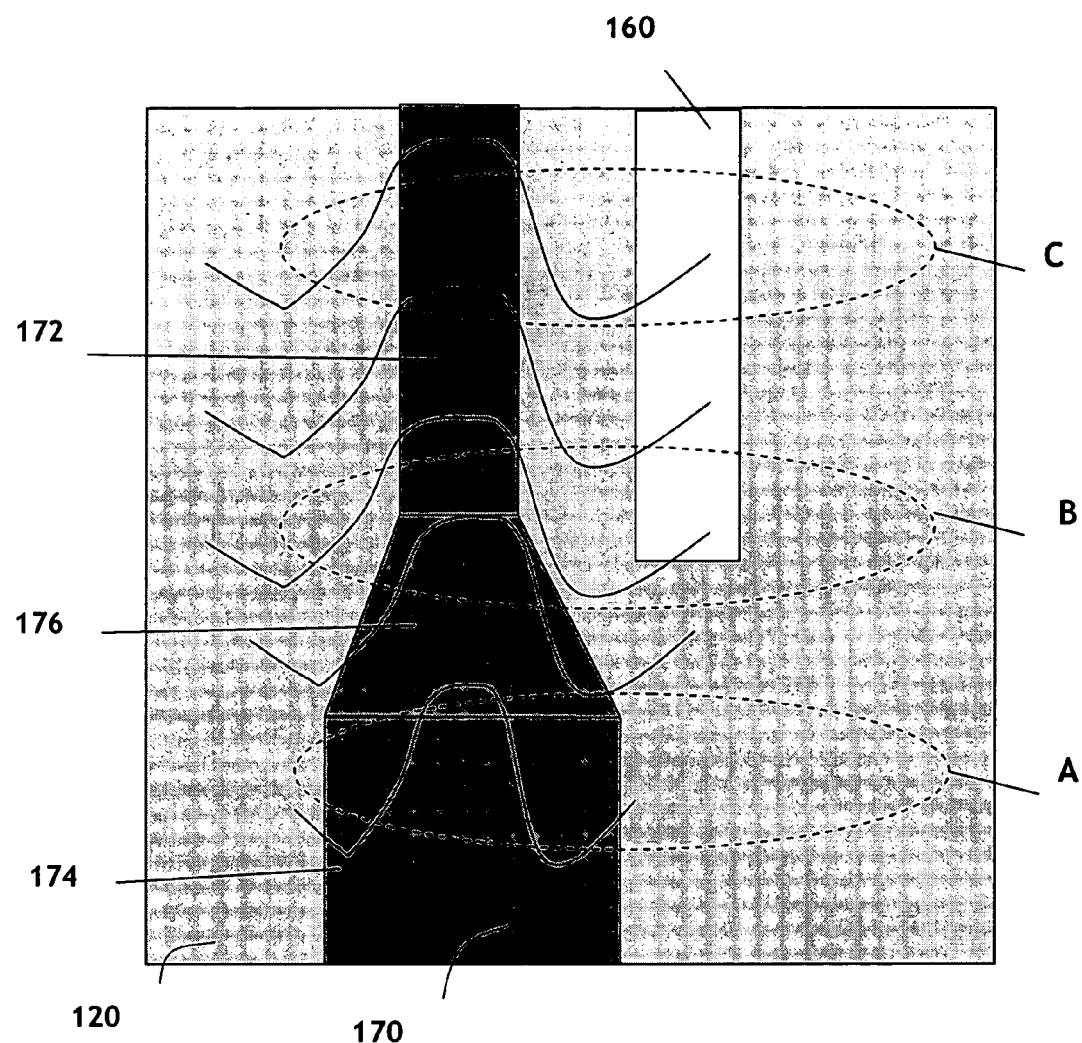
FIG. 4A depicts a schematic top view demonstrating mode coupling in the integrated optoelectronic device according to one embodiment of the invention.
Figure 4C:
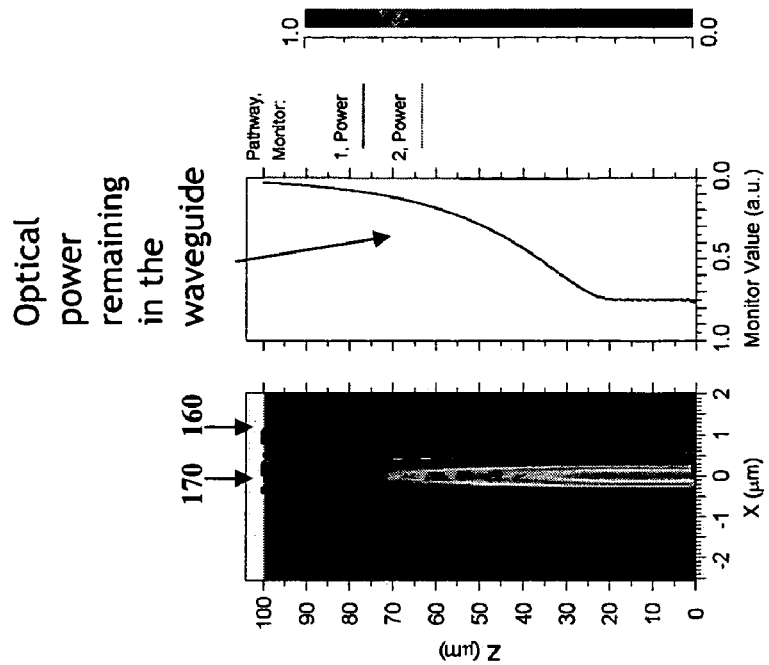
FIGS. 4B-4C depict optical simulations of transverse field profiles in the embodiment of FIG. 4A with and without propagation constant matching.
Figure 4B:
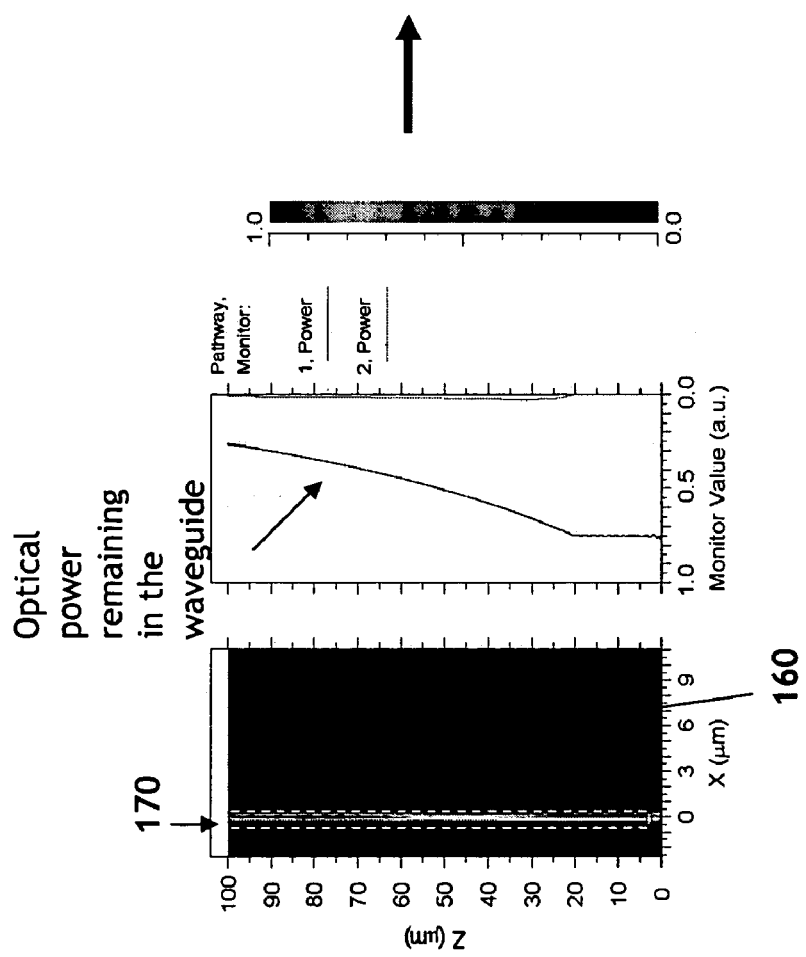

As described above, in many embodiments, the waveguide's lateral dimension is tapered to reduce its width where evanescent coupling with the photodetector occurs. As a result, the evanescent tail of the lightwave in the waveguide expands laterally, improving coupling efficiency. As skilled artisans will note, it is generally difficult to efficiently achieve a vertical tapered structure in order to gradually decrease spacing between the waveguide and photodetector. Lateral configuration of the components according to various embodiments of the present invention, however, simplify waveguide tapering. Referring now to FIG. 4A, as mentioned above, in various embodiments, the waveguide 170 includes a narrow portion 172, a wide portion 174, and an intermediate tapered portion 176 disposed therebetween. The narrow portion 172 is generally disposed proximate to the photodetector 160. Width of the tapered portion continuously decreases from the wide portion towards the narrow portion. As the lightwave propagates from a region A to a region B, the evanescent tail of the lightwave gradually expands and the mode changes towards matching of the propagation constant. In a region C, a waveguide mode phase-matches the mode in the photodetector resulting in the efficient evanescent coupling substantially void of back-reflection. FIGS. 4B-4C depict optical simulations of transverse field profiles in the embodiment of FIG. 4A without (FIG. 4B) and with (FIG. 4C) propagation constant matching at the gap D of about 0.2 μm. As shown in these Figures, matching propagation constants of the waveguide and photodetector in the integrated photodetector apparatus significantly increases the coupling efficiency and rate, compared to the apparatus where these constants are not matched. Thus, in various embodiments of the invention, employing propagation-constant matching eases processing constraints during fabrication of the integrated photodetector apparatus by allowing for a larger spacing gap D for a given coupling efficiency and rate.

Figure 5:
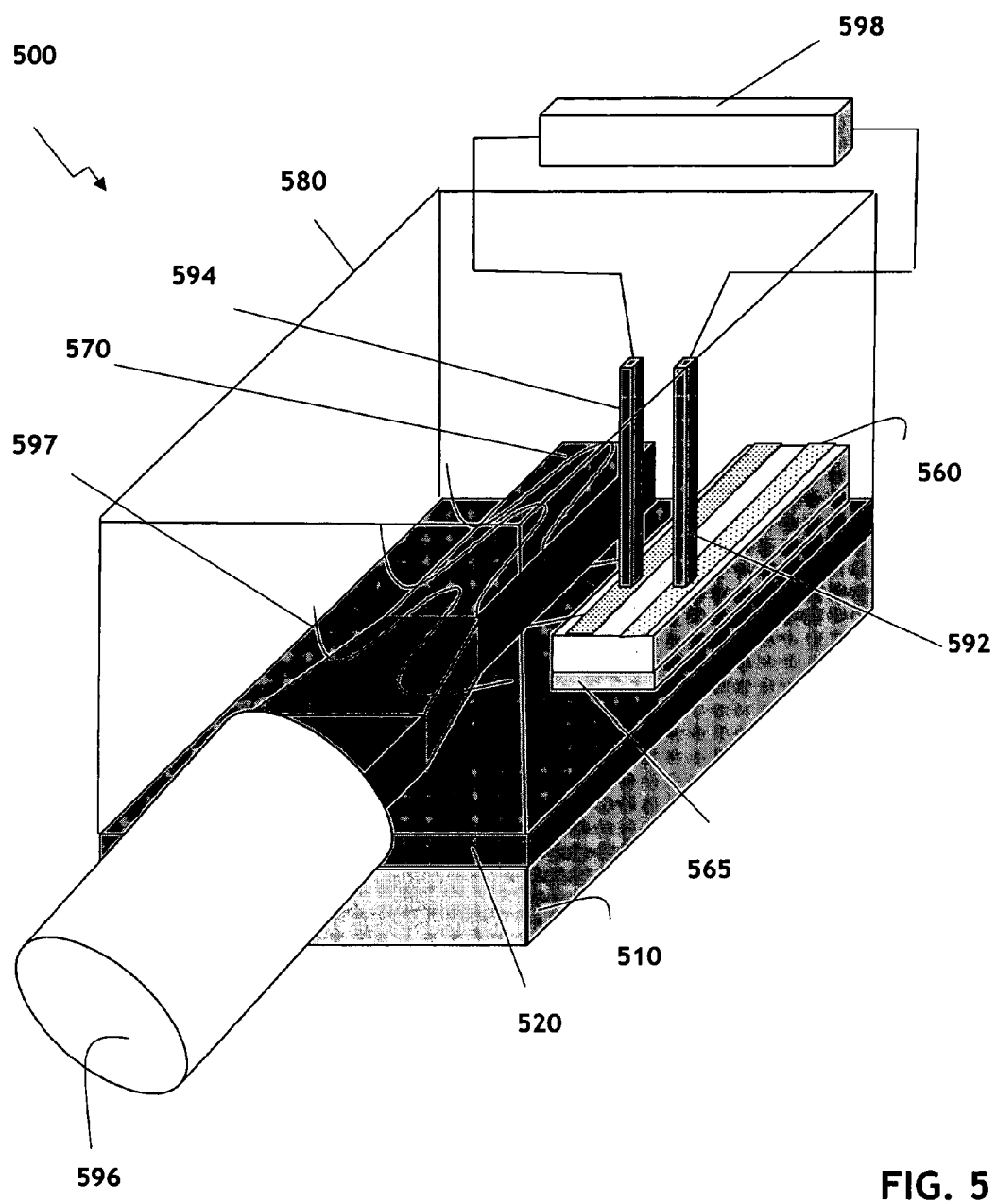
FIG. 5 depict schematic perspective view of an optoelectronic circuits utilizing integrated devices formed as illustrated in the preceding Figures.

As mentioned above, various optoelectronic circuits can be fabricated employing integrated photodetector apparatus implemented according to any of the embodiments described above. Referring to FIG. 5, in many embodiments, an optoelectronic circuit 500 employs an integrated photodetector apparatus 505 implemented according to any of the embodiments of the photodetector apparatus described above. The apparatus 505 includes an optical waveguide 570 evanescently coupled to a photodetector 560 disposed over an interface region 565. The waveguide and the photodetector are laterally aligned and formed over a bottom cladding layer 520 disposed over a base semiconductor layer 510.

The circuit further includes an optical or optoelectronic device 596 optically coupled to the optical waveguide at its input end. The device 596 is capable of generating an optical signal carried by or otherwise represented by lightwave 597. In a particular embodiment, the device 596 includes a microprocessor (not shown) and a light-emitting device (not shown) such as a diode laser or a light-emitting diode. The circuit 500 further includes an electronic or optoelectronic device 598 electrically coupled to the contact regions 592, 594 of the photodetector. The device 598 is any device capable of receiving and processing an electrical signal generated in the photodetector, including, but not limited to, a microprocessor, a filter, an amplifier, or any combination thereof. The device 598 could include or be further connected to any other type of signal-processing element or circuit.

In operation, the device 596 emits an optical signal represented by or carried by the lightwave 597, which is coupled into optical waveguide 570. The lightwave propagates in the waveguide through, e.g., the tapered section 176 and into the section 172 (see FIGS. 2, 3A, 4A), where the lightwave is evanescently coupled into the intrinsic region of the photodetector 560. The light in intrinsic region is converted to photon-generated carriers, which diffuse to contact regions 592, 594 resulting in the electrical signal. The electrical signal is then carried to and processed by the device 598.

Other embodiments incorporating the concepts disclosed herein, as well as many modifications, variations, and changes to the embodiments described above, are possible without departing from the spirit of the essential characteristics of the invention or the scope thereof. The foregoing embodiments are therefore to be considered in all respects as only illustrative rather than restrictive of the invention described herein. Therefore, it is intended that the scope of the invention be only limited by the following claims.

The invention claimed is:

1. An integrated photodetector apparatus comprising:
   (a) a substrate comprising a first cladding layer disposed over a base layer, the base layer comprising a first semiconductor material;
   (b) an optical waveguide having a first propagation constant and disposed over the substrate;
   (c) an interface region comprising the first semiconductor material and disposed over the first cladding layer; and
   (d) a photodetector having a second propagation constant substantially equal to the first propagation constant, the photodetector comprising a second semiconductor material epitaxially grown over the interface region and having a source region and a drain region separated by an intrinsic region formed in the second semiconductor material, at least a portion of the intrinsic region being laterally aligned with and evanescently coupled to the optical waveguide.

2. The photodetector apparatus of claim 1 wherein the largest cross-sectional dimension of the photodetector does not exceed a length of absorption of photocarriers therein.

3. The photodetector apparatus of claim 1 wherein the optical waveguide comprises a first portion and a second portion, the at least a portion of the intrinsic region being laterally aligned with and evanescently coupled at least to the second portion, a width of the first portion exceeding a width of the second portion.

4. The photodetector apparatus of claim 3 wherein a width of the first portion ranges from about 0.5 µm to about 1.5 µm.

5. The photodetector apparatus of claim 1 wherein the first semiconductor material comprises single-crystal silicon and the first cladding layer comprises silicon dioxide.

6. The photodetector apparatus of claim 1 wherein the photodetector comprises germanium or a silicon-germanium alloy having a germanium concentration exceeding about 90%.

7. The photodetector apparatus of claim 1 wherein the optical waveguide comprises silicon, silicon nitride, or silicon oxynitride.

8. The photodetector apparatus of claim 1, further comprising contact regions in electrical communication with the source and the drain regions.

9. The photodetector apparatus of claim 1 wherein a thickness of the photodetector does not exceed about 1.5 µm.

10. The photodetector apparatus of claim 1 wherein a thickness of the interface region is about 0.2 µm.

11. The photodetector apparatus of claim 1 wherein a distance between the optical waveguide and the photodetector is less than about 1 µm.

12. The photodetector apparatus of claim 1, further comprising a second cladding layer disposed over the optical waveguide and the photodetector.

13. The photodetector apparatus of claim 12 wherein the second cladding layer comprises silicon dioxide.

14. An integrated photodetector apparatus comprising:
   (a) a substrate comprising a first cladding layer disposed over a base layer, the base layer comprising a first semiconductor material;
   (b) an optical waveguide having a first propagation constant and disposed over the substrate;
   (c) an interface region disposed over the first cladding layer, the interface region comprising the first semiconductor material, a first doped region being formed therein; and
   (d) a photodetector having a second propagation constant substantially equal to the first propagation constant, the photodetector comprising a second semiconductor material epitaxially grown over the interface region and having a second doped region and an intrinsic region disposed thereunder, at least a portion of the intrinsic region being laterally aligned with and evanescently coupled to the optical waveguide, one of the doped regions comprising a source region and the other doped region comprising a drain region.

15. The photodetector apparatus of claim 14 wherein the largest cross-sectional dimension of the photodetector does not exceed a length of absorption of photocarriers therein.

16. The photodetector apparatus of claim 14, further comprising contact regions in electrical communication with the source and the drain regions.

17. An optoelectronic circuit comprising:
   (a) an integrated photodetector apparatus, comprising:
      an interface region disposed over a substrate including a first cladding layer disposed over a base layer, the interface region and the base layer comprising single-crystal silicon,
      an optical waveguide having a first propagation constant and disposed over the first cladding layer,
      a photodetector having a second propagation constant substantially equal to the first propagation constant, the photodetector comprising a semiconductor material epitaxially grown over the interface region and having a source region and a drain region separated by an intrinsic region, at least a portion of the intrinsic region being laterally aligned with and evanescently coupled to the optical waveguide, the largest cross-sectional dimension of the photodetector not exceeding a length of absorption of photocarriers therein, and
      a second cladding layer comprising silicon dioxide and disposed over the optical waveguide and the photodetector;

(b) a light source in optical communication with an input end of the optical waveguide for directing a lightwave thereto; and (c) an electronic device electrically coupled to the source and drain regions for receiving and processing an electrical signal generated in the photodetector.

18. An optoelectronic circuit comprising:
   (a) an integrated photodetector apparatus, comprising:
      an interface region comprising a first doped region formed therein and disposed over a substrate including a first cladding layer disposed over a base layer, the interface region and the base layer comprising single-crystal silicon,
      an optical waveguide having a first propagation constant and disposed over the first cladding layer,
      a photodetector having a second propagation constant substantially equal to the first propagation constant, the photodetector comprising a semiconductor material epitaxially grown over the interface region and having a second doped region and an intrinsic region disposed thereunder, at least a portion of the intrinsic region being laterally aligned with and evanescently coupled to the optical waveguide, the largest cross-sectional dimension of the photodetector not exceeding a length of absorption of photocarriers therein, one of the doped regions comprising a source region and the other doped region comprising a drain region, and
      a second cladding layer comprising silicon dioxide and disposed over the optical waveguide and the photodetector;
   (b) a light source in optical communication with an input end of the optical waveguide for directing a lightwave thereto; and
   (c) an electronic device electrically coupled to the source and drain regions for receiving and processing an electrical signal generated in the photodetector.

19. A method for manufacturing an integrated photodetector apparatus, the method comprising:
   (a) providing a silicon-on-insulator substrate including an interface region comprising single-crystal silicon and disposed over a first cladding layer comprising silicon dioxide;
   (b) epitaxially growing a lattice-mismatched semiconductor layer over the interface region of the substrate;
   (c) removing a portion of the lattice-mismatched semiconductor layer and a portion of the interface region to (i) form a photodetector including an intrinsic region, and (ii) expose a portion of the first cladding layer;
   (d) forming an optical waveguide over the exposed portion of the first cladding layer, such that at least a portion of the intrinsic region is laterally aligned with and evanescently coupled to the optical waveguide; and
   (e) forming a source region and a drain region in the photodetector.

20. The method of claim 19, further comprising forming contact regions electrically coupled to the source and drain regions.

21. The method of claim 19, further comprising depositing a second cladding layer comprising silicon dioxide over the optical waveguide and the photodetector.

22. The method of claim 19 wherein the lattice-mismatched semiconductor layer consists essentially of germanium.

23. The method of claim 19 wherein the lattice-mismatched semiconductor layer comprises germanium or a silicon-germanium alloy having a germanium concentration exceeding about 90%.

24. The method of claim 19 wherein the optical waveguide comprises silicon, silicon nitride, or silicon oxynitride.

25. The method of claim 19 wherein the step of epitaxially growing the lattice-mismatched semiconductor layer comprises:
   (a) depositing a semiconductor material over the interface region at a first temperature to form a buffer layer; and
   (b) depositing the semiconductor material over the buffer layer at a second temperature until a final thickness is obtained.

26. The method of claim 25 wherein a thickness of the buffer layer ranges from about 30 nm to about 60 nm.

27. The method of claim 25 wherein the final thickness does not exceed about 1.5 µm.

28. The method of claim 25 wherein the second temperature is greater than the first temperature.

29. The method of claim 19 wherein the step of epitaxially growing the lattice-mismatched semiconductor layer comprises further comprises annealing the semiconductor material.

30. The method of claim 29 wherein the semiconductor material is annealed by rapid thermal annealing at a temperature of about 850° C. for about 3 minutes.

31. The method of claim 29 wherein the semiconductor material is annealed at a temperature greater than about 850° C. for at least 30 minutes.

32. The method of claim 19 wherein the largest cross-sectional dimension of the photodetector does not exceed an absorption length of photocarriers therein.

33. The photodetector apparatus of claim 19 wherein a distance between the optical waveguide and the photodetector is less than about 1 µm.

34. A method for manufacturing an integrated photodetector apparatus, the method comprising:
   (a) providing a silicon-on-insulator substrate including an interface region comprising single-crystal silicon and disposed over a first cladding layer comprising silicon dioxide;
   (b) forming a first doped region in the interface region;
   (c) epitaxially growing a lattice-mismatched semiconductor layer over the interface region of the substrate and at least partially over the first doped region;
   (d) removing a portion of the lattice-mismatched semiconductor layer and a portion of the interface region to (i) form a photodetector including an intrinsic region and (ii) expose a portion of the first cladding layer; and
   (e) forming an optical waveguide over the exposed portion of the first cladding layer, such that at least a portion of the intrinsic region is laterally aligned with and evanescently coupled to the optical waveguide.

35. The method of claim 34, further comprising:
   (i) forming a second doped region in the photodetector, one of the doped regions comprising a source region and the other doped region comprising a drain region, and
   (ii) forming contact regions electrically coupled to the source and drain regions.

* * * * *